US006066434A

United States Patent [19]

Blanchet-Fincher et al.

[11] Patent Number: 6,066,434

[45] Date of Patent: May 23, 2000

[54] WATERLESS PRINTING PLATES

[75] Inventors: Graciela Beatriz Blanchet-Fincher, Wilmington; Peter Walker, Hockessin, both of Del.

[73] Assignee: E. I. du Pont de Nemours and Company, Wilmington, Del.

[21] Appl. No.: 09/011,638

[22] PCT Filed: Aug. 15, 1996

[86] PCT No.: PCT/US96/13354

§ 371 Date: Feb. 13, 1998

§ 102(e) Date: Feb. 13, 1998

[87] PCT Pub. No.: WO97/06956

PCT Pub. Date: Feb. 27, 1997

Related U.S. Application Data

[60] Provisional application No. 60/002,566, Aug. 21, 1995.

[51] Int. Cl.[7] .......................................................... G03F 7/00

[52] U.S. Cl. ..................................... 430/273.1; 430/271.1; 430/275.1; 430/278.1; 430/303; 430/944; 101/463.1

[58] Field of Search .............................. 430/275.1, 278.1, 430/272.1, 273.1, 303, 944; 101/463.1

[56] References Cited

U.S. PATENT DOCUMENTS

| | | | |
|---|---|---|---|
| 3,859,090 | 1/1975 | Yoerger et al. | 96/1.5 |
| 3,975,352 | 8/1976 | Yoerger et al. | 260/33.8 F |
| 4,170,687 | 10/1979 | Spicer et al. | 428/421 |

FOREIGN PATENT DOCUMENTS

| | | | |
|---|---|---|---|
| 0 079 590 A1 | 5/1983 | European Pat. Off. | C07C 43/11 |
| 0 113 925 A2 | 7/1984 | European Pat. Off. | G03G 13/28 |
| 0 306 932 B1 | 3/1989 | European Pat. Off. | B41N 1/12 |
| 0 471 483 A1 | 2/1992 | European Pat. Off. | G03F 7/038 |
| 2 366 134 | 9/1977 | France | B41N 1/14 |
| 62-161154 | 7/1987 | Japan | G03F 7/02 |
| 63-22687 | 1/1988 | Japan | B41N 1/14 |
| 2-61730 | 12/1990 | Japan | G03F 7/00 |
| 94/01280 | 1/1994 | WIPO | B41C 1/055 |

*Primary Examiner*—Janet Baxter
*Assistant Examiner*—Barbara Gilmore

[57] ABSTRACT

Printing plates for dry development wherein the plate is made up of a radiation absorbing layer positioned between a hydrophobic, substantially non-radiation absorbing film layer and a support. Such plates are typically exposed using a laser.

19 Claims, 3 Drawing Sheets

WATERLESS PRINTING PLATES

CROSS-REFERENCE TO RELATED APPLICATIONS

This application claims the benefit of U.S. Provisional Application 60/002,566, filed Aug. 21, 1995 and PCT International Application PCT/US96/13354, filed Aug. 15, 1996, wherein the United States was a designated country.

FIELD OF THE INVENTION

The invention generally relates to printing plates for dry development, also known as waterless printing plates. In particular, the invention relates to waterless printing plates having a radiation absorbing layer positioned between a hydrophobic film and a support. The invention is also directed to a method for developing said waterless printing plates.

BACKGROUND OF THE INVENTION

Waterless printing (sometimes known as driography) is a method of printing that provides high quality reproduction without recourse to a dampening system, or fountain solution, on the printing press. Without the problem of water-induced ink emulsification, prints exhibit sharper dots and good tonal gradation with little variation in density throughout the printing run. These improvements are accomplished without sacrificing printing speed or cost.

The main advantage of a waterless system is that imaging only requires exposure and not a subsequent wet development step. This allows an exposure system to be included in the press itself, so that plates can be mounted, exposed and inked directly without the need to remove the exposed plates for development.

Printing plates can be exposed by various kinds of radiation, in an analog or digital fashion, including thermal and laser radiation. (See generally Kirk-Othmer Encyclopedia of Chemical Technology, Vol. 19, 1982, pages 110–163). The use of lasers to expose printing plates is known to those skilled in the art, and it is preferred that the inventive plates described hereinafter be exposed by laser radiation.

Many modifications to printing plates for use in waterless printing have been proposed in the past but all require wet development. Recent work on waterless, or dry, plates, which require no dampening solutions, has employed organopolysiloxane as an ink-repelling layer which is adhered to a photosensitive layer containing a quinone diazide (see C. Ichijo and M. Asano, Japanese Patent Application No. 62-161154, Jul. 17, 1987). Other work by N. Kawabe, et al., Japanese Patent Publication No. 2-61730, Dec. 20, 1990, describes a photosensitive resin layer without pigments or dyes, which absorbs UV light, and a top layer made of silicone rubber. However, after analog exposure, this printing plate is wet developed.

T. Taguchi and K. Ueyama disclose in Japanese Patent Application No. 63-22687, Jan. 30, 1988, a multilayer waterless plate having a non-uniform fluorinated layer on top. This fluorinated material, is in the form of a dispersion, rather than in solution as described in the present invention. Also, the image is made with a hot nib thermal line printer, which does not involve removing any material from the surface during exposure.

European Patent 0 306 932 B1 (Jun. 29, 1994) discloses a single layer printing plate containing polytetrafluoroethylene. This plate is used for relief printing, and after photopolymerization, the remaining non-polymerized material, which is soluble, is removed.

Clearly, waterless printing plates and a method of developing said plates, which overcome some of the problems and deficiencies of the prior art, are needed. Other objects and advantages of the present invention will become apparent to those skilled in the art upon reference to the drawings and detailed description which hereinafter follows.

SUMMARY OF THE INVENTION

The invention provides a printing plate, comprising:

(a) a support of sufficient thickness to provide structural integrity and to allow for repeated use;

(b) a radiation absorbing layer contiguous to said support comprising (i) a polymer with a temperature of decomposition in the range of 130° C. to 360° C., and (ii) means for absorbing radiation; and (c) a layer comprising a hydrophobic, substantially non-radiation absorbing film compared to the radiation absorbing layer, which is soluble in fluorinated solvents, and which is contiguous to said radiation absorbing layer, said film having a substantially uniform surface and a thickness of less than about 2.0 μm.

Preferably, the radiation absorbing layer and the hydrophobic film layer each have a thickness of between about 0.1 to 2.0 μm. More preferably, the radiation absorbing layer has a thickness of between about 0.3 to 1.0 μm and the hydrophobic film has a thickness of between about 0.2 to 0.6 μm. Moreover, the polymer used in the radiation absorbing layer preferably has a temperature of decomposition of between about 150° C. to 300° C. The polymer is also relatively hydrophilic.

In one embodiment of the invention, the radiation absorbing means comprises a dye or pigment whose absorption matches the wavelength of a chosen radiation source, which is generally a laser.

In another embodiment, the radiation absorbing means comprises a separate layer, generally a metal or a metal oxide, which is positioned either between the polymer making up the radiation absorbing layer and the hydrophobic film or between the support and the polymer making up the radiation absorbing layer; the former being preferred.

It will be understood that combinations of the above-described radiation absorbing means may also be employed. In other words, in addition to being used separately, the dye or pigment can be used in combination with the metal or metal oxide layer to provide appropriate radiation absorption.

In anther aspect, the invention comprises a method for developing a printing plate comprising the steps of:

(A) exposing a printing plate comprising:

(1) a support of sufficient thickness to provide structural integrity to allow for repeated use;

(2) a radiation absorbing layer contiguous to said support, comprising (a) a polymer with a temperature of decomposition in the range of 130° C. to 360° C., and (b) means for absorbing radiation; and (3) a layer comprising a hydrophobic, substantially non-radiation absorbing film, compared to the radiation absorbing layer, which is soluble in fluorinated solvents, and which is contiguous to said radiation absorbing layer, said film having a substantially uniform surface and a thickness of less than about 2.0 μm;

to a radiation source such that certain patterned regions of the hydrophobic film are removed thereby exposing the radiation absorbing layer; and (B) applying printing ink such that the ink adheres only to the exposed radiation absorbing layer where the hydrophobic film has been removed but not to the unexposed regions where the hydrophobic film has not been removed.

BRIEF DESCRIPTION OF THE DRAWINGS

FIG. 1 shows schematic view of certain embodiments of the printing plates of the invention.

FIG. 2 shows a schematic of the pilot coater used to produce some of the printing plates of the invention.

DETAILED DESCRIPTION OF THE PREFERRED EMBODIMENTS

Figure 1A:
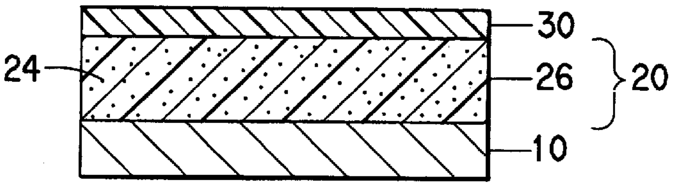
FIG. 1A shows an embodiment wherein the radiation absorbing layer comprises a polymer and a dye or pigment which acts to absorb radiation.

A waterless printing plate has been developed which is comprised of three (3) basic layers, and contiguous to, a relatively hydrophilic radiation absorbing layer, which, in turn, is contiguous to a support.

By "fluorinated solvent" is meant a solvent analogous to those made from hydrocarbons in which the hydrogen atoms have been replaced by fluorine.

By "fluoropolymer" is meant polymers (including copolymers) analogous to those made from hydrocarbons in which the hydrogen atoms have been replaced by fluorine.

By "substantially uniform surface" is meant that the difference in the contact angles (receding to advancing) for water is less than about 30 degrees, wherein the method of measuring contact angles is described in S. Wu, "Polymer Interface and Adhesion" (Marcel Dekker, Inc., NY-ISBN 0-8247-1533-9), pp. 260–261, the contents of which are incorporated herein. This could also be referred to as advancing contact angles with hysteresis less than 30 degrees. This would indicate a very smooth and uniform film surface.

By "radiation absorbing layer" is meant a layer comprising a polymer having a temperature of decomposition between about 130° C. to 360° C. and some means to absorb radiation and produce sufficient heat to decompose the polymer, such as dye or pigment which is chosen to absorb the radiation produced by the source of radiation, e.g., a laser, and manifest it as heat. Alternatively, the dye or pigment can be omitted (although it doesn't have to be), and a separate thin coating or layer, generally a metal or metal oxide, may be deposited onto either surface of the polymer. It is preferred that this separate layer be selected from the following metals, including: aluminum, chromium, antimony, titanium, bismuth, zirconium, nickel, strontium, indium, zinc and stainless steel, and their oxides and alloys.

The polymer is chosen so that it degrades or decomposes after the radiation energy is absorbed, and is completely or partially removed from the surface of the support onto which it is positioned, thereby also removing the hydrophobic film material coated onto it. Preferred polymers include polyvinylchloride (PVC), nitrocellulose, chlorinated polyvinylchloride (CPVC), poly(butylmethacrylate), poly(α-methylstyrene), poly(propylene carbonate), and poly (methylmethacrylate).

By "substantially non-radiation absorbing film" is meant that, compared to the radiation absorbing film, there is substantially no radiation absorbed by the film. Generally, this means that the non-radiation absorbing film layer is capable of absorbing no more than about 0.1% of the radiation absorbed by the radiation absorbing layer.

By "temperature of decomposition" is meant the temperature at which a polymer breaks down into simpler units, such as monomers or other degradation products. It is also know in the art as "temperature of degradation" and is represented by Td.

In use, the inventive printing plate is exposed to a radiation source which causes local heating and polymer decomposition in the radiation absorbing layer. The printing plates can preferably be digitally exposed using either infrared diode lasers of wavelengths in the 730 to 850 nm spectral range or by high power air cooled diode-pumped Nd-YAG or Nd-YLF lasers. Although these particular lasers and wavelengths have been found to be useful in the invention, many others may also be used depending on size and cost considerations. In particular, any wavelength that will match the radiation absorbing material of the absorbing layer and create sufficient thermal energy can be used. Other non-limiting exposure techniques include thermal head exposure and visible laser exposure.

While this invention is not limited by any particular theory or explanation of operation, the suggested and presently preferred mode of operation of the inventive printing plate (see FIG. 1A) is the absorption of laser radiation by the radiation absorbing layer 20 positioned between the support 10 and hydrophobic film 30. The plate is exposed through the hydrophobic film and the energy is absorbed by a pigment, such as carbon black, or dye 24 contained within the polymeric radiation absorbing layer 20. One such preferred dye is Tic-5C, 2-[2-[2-chloro-3-[2-(1,3-dihydro-1,2,2-trimethyl-2H-indol-2-ylidene)ethylidene]-1-cyclopenten-1-yl]ethenyl]-1,3,3-trimethyl-3H-indolium, trifluoromethane sulfonate salt (E. I. du Pont de Nemours and Company, Wilmington, Del.), whose structure is shown below. This dye absorbs the radiation from the above-mentioned laser in the range of about 730 to 850 nm. Other dyes which find utility in this invention include SQS (thiopyrylium, 4-[[3-[[2,6-bis(1,1-dimethylethyl)-4H-thiopyran-4-ylidene]methyl]-2-hydroxy-4-oxo-2-cyclobuten-1-ylidene]methyl]-2,6-bis(1,1-dimethylethyl)-, inner salt; Registry number 88878-49-3, commercially available from E. I. du Pont de Nemours and Company, Wilmington, Del.), and 1,1',3,3,3',3'-hexamethylindotricarbocyanine iodide (HITC, Kodak, Rochester, N.Y.). The structures of these dyes are also shown below.

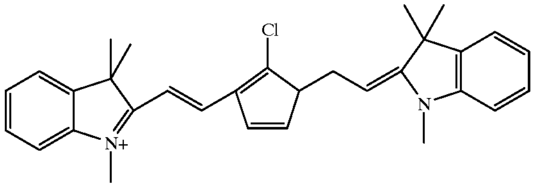

Tic-5C Dye

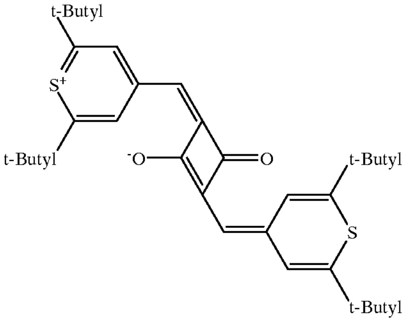

SQS Dye

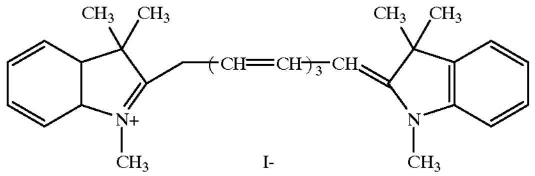

1,1',3,3,3',3'-Hexamethylindotricarbocyanine Iodide Dye

The incident radiation is rapidly converted into heat, locally decomposing the polymer in the radiation absorbing layer. The polymer in the radiation absorbing layer has a low decomposition temperature, and its decomposition leads to polymer fragmentation and the formation of gaseous products that provide propulsion forces for the removal of the contiguous hydrophobic film. Table 1 lists various non-limiting polymers which may be used in the invention and their corresponding temperatures of decomposition.

TABLE 1

Temperature of Decomposition (Td) of Polymers Used in Radiation Absorbing Layer

| Polymer | Td, ° C. |
|---|---|
| E1010 (Elvacite ® 1010, PMMA, DuPont, Wilmington, DE) | 176 |
| E2051 (Elvacite ® 2051, PMMA, DuPont, Wilmington, DE) | 350 |
| Nitrocellulose (Hercules, Inc., Wilmington, DE) | 194 |
| Poly α-Methyl Styrene (Aldrich Chem., Milwaukee, WI) | 240 |
| QPAC-40 (Polypropylene Carbonate, Air Products, Inc., Trexlertown, PA) | 160 |
| Polyvinylchloride (Aldrich Chem., Milwaukee, WI) | 282 |

The temperatures of decomposition were measured according to the TGA method generally described in Billmeyer et al., "Textbook of Polymer Sciences", 2nd Ed., pp. 122–123, the contents of which are incorporated herein.

Figure 1B:
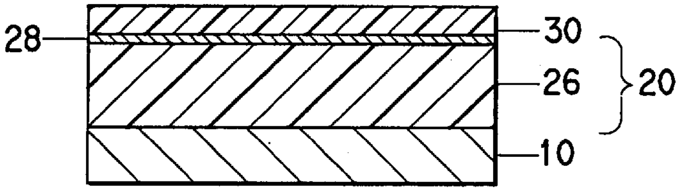
FIG. 1B shows an embodiment wherein the dye or pigment is omitted from the polymer of the radiation absorbing layer, but which instead includes a separate radiation absorbing layer between the polymer and the hydrophobic film layer.
Figure 1C:
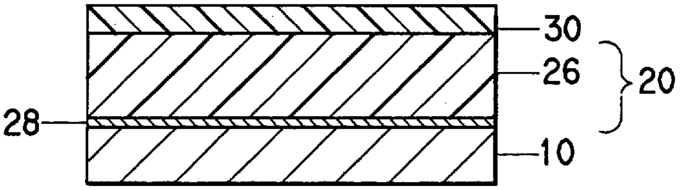
FIG. 1C shows an embodiment wherein the dye or pigment is omitted from the polymer of the radiation absorbing layer, but which instead includes a separate radiation absorbing layer between the polymer and the support.
Figure 1D:
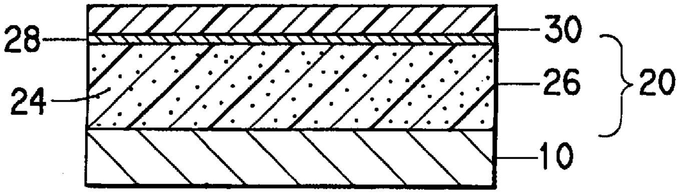
FIG. 1D shows an embodiment wherein the radiation absorbing layer comprises a polymer and a dye or pigment, and, in addition, a separate radiation absorbing layer between the polymer and the hydrophobic film layer.

In another embodiment, the dye or pigment can be omitted from the radiation absorbing layer, and instead, a separate layer of a radiation absorbing material 28, generally a metal or a metal oxide, can be positioned either between the polymer 26 of the radiation absorbing layer 20 and the support 10 (see FIG. 1C), or between the polymer 26 of the radiation absorbing layer and the hydrophobic film layer 30 (see FIG. 1B). (As noted before, this can also occur in combination with a dye or pigment so that the dye or pigment is not omitted (see FIG. 1D)). This separate layer can be applied using any of the well-known techniques for providing thin metal layers such as sputtering, chemical vapor deposition or electron beam. The hydrophobic film layer is positioned (typically coated) on top of the radiation absorbing layer. In use, the incident radiation is absorbed by the metal layer, just like when a dye or pigment is used, and converted into heat leading to the decomposition of the adjacent areas of the polymer.

Figure 3A:
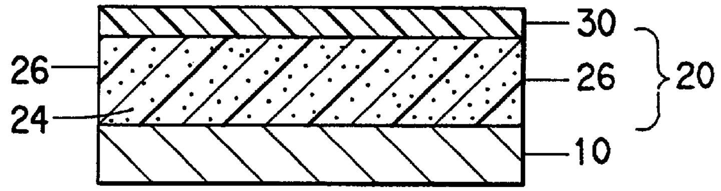
FIGS. 3A and 3B show the printing plate of FIG. 1A before and after exposure with a laser.
Figure 3B:
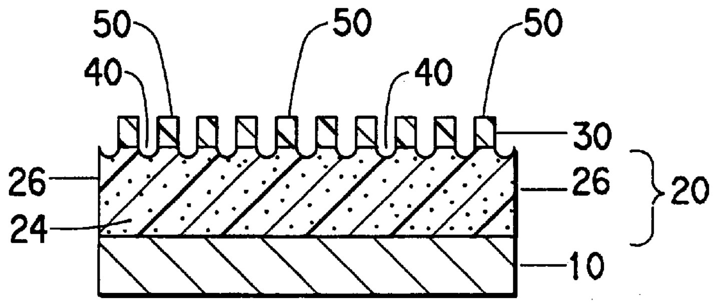

After exposure to a radiation source, in each described embodiment, the plates contain exposed regions 40 without the hydrophobic film and unexposed regions 50 where the hydrophobic film remains intact (see FIG. 3A (before exposure) and FIG. 3B (after exposure) for embodiment of FIG. 1A). When the plate is inked with water-based ink dispersions, the ink adheres to the exposed relatively-hydrophilic regions 40 of the radiation absorbing layer 20, while it is repelled from the unexposed areas 50 of the hydrophobic film 30. To use these plates with oil-based inks, the top hydrophobic film can be modified by the addition of a modifier, for example, a fluoropolymer containing at least one $CF_3$ group, a fluorinated silicone or a fluorinated acrylate, which would still allow the material from which this hydrophobic film is made to remain soluble in the fluorinated solvents described herein.

Examples of materials for use in the hydrophobic film layer, which are soluble in fluorinated solvents, include a copolymer of polytetrafluoroethylene and bis-2,2-trifluoromethyl-4,5,-difluoro-1,3-dioxole (Teflon AF1601®, E. I. du Pont de Nemours and Company, Wilmington, Del.) and copolymers of hexafluoropropylene (HFP) and tetrafluoroethylene (TFE), where the weight percent of TFE ranges from about 20 percent to about 60 percent, and the weight percent of HFP ranges from about 80 percent to about 40 percent. Generally, perfluorinated copolymers are preferred.

The advance and receding contact angles are about 120° and 102°, respectively, for Teflon AF1601® and the HFP/TFE copolymer. For purposes of this disclosure, the HFP/TFE copolymer will be shown as $TFE_xHFP_{1-x}$, where 0.2<x<0.6. The synthesis of this copolymer is disclosed in U.S. patent application Ser. No. 08/384,068, filed Feb. 6, 1995, now U.S. Pat. No. 5,478,905.

The support can be fabricated of any material which, will sufficient thickness, can provide structural integrity and allow for repeated use. Examples of suitable materials include anodized aluminum, aluminized polyester, polyester, and aluminized stainless steel.

A particular preferred embodiment of the present invention comprises a waterless printing plate, with an aluminum support of sufficient thickness to provide the necessary structural integrity for repeated use, a radiation absorbing layer comprising polyvinyl chloride, chlorinated polyvinyl chloride, or nitrocellulose, Tic-5c at a level of about 10% by weight with a thickness of about 0.1 to about 2.0 μm, and a top hydrophobic film comprised of $TFE_xHPF_{1-x}$, where 0.2<x<0.6, most preferably x=0.59, with a thickness of about 0.2 to about 0.6 μm.

TABLE 2

| CONTACT ANGLES, WATER | | | |
|---|---|---|---|
| | CONTACT ANGLE, Deg. | | |
| SAMPLE MATERIAL* ($\mu$M) | ADVANCING | RECEDING | DIFF (HYSTERESIS) |
| NC (1) | 76 | 45 | 31 |
| PMMA (1) | 70 | 55 | 15 |
| QPAC-40 (1) | 75 | 41 | 34 |
| PVC (1) | 79 | 45 | 34 |
| NC + Tic (0.25) | 67 | 35 | 32 |
| NC + Tic (1) | 70 | 37 | 33 |
| TFE/HFP (1) | 119 | 105 | 14 |
| NC + Tic (0.25)/ TFE/HFP (0.1) | 116 | 99 | 17 |
| NC + Tic (1)/ TFE/HFP (0.1) | 119 | 102 | 17 |
| NC + Tic (1)/ TFE/HFP (0.25) | 117 | 103 | 14 |
| NC + Tic (1)/ TFE/HFP (0.75) | 115 | 101 | 14 |
| NC + Tic (1)/ TFE/HFP (1) | 114 | 103 | 11 |

*NC = Nitrocellulose
Tic = Tic-5c
PMMA = Poly(methylmethacrylate)
QPAC-40 = Poly(propylene carbonate)
PVC = Polyvinyl chloride
TFE/HFP = $TFE_{0.59}HFP_{0.41}$, copolymer of tetrafluoroethylene and hexafluoropropylene The hydrophobic film is soluble in fluorinated solvents such as FC-75 (Fluorinert® FC-75, $C_8F_{16}O$ cyclic ethers mainly perfluoro-2-n-butyl tetrahydrofuan, 3M Co., St. Paul, Minn.) preferably to the extent of between about 1 and 30% by weight.

In a preferred embodiment of the present invention, the hydrophobic film layer comprises a perfluoro-copolymer, which has a uniform, smooth surface. As set forth above, uniform, smooth surface means that there is less than about a 30 degree difference between the advancing and receding contact angles for water (see Table 2 for various examples).

In use, the printing plate is preferably exposed to laser radiation, and the hydrophobic film is ablated from the exposed areas as the underlying, radiation absorbing polymeric layer decomposes, producing sufficient gas to cleanly remove the hydrophobic film; thus, no further cleaning step is necessary. The uncovered radiation absorbing layer is then available to accept the subsequently applied printing ink. Water-based ink is repelled by the remaining hydrophobic layer.

By "sensitivity", or "fluence", is meant a measure of the amount of energy needed to remove an amount of material, and it is typically reported in terms of mJ/cm$^2$.

"Optical density" (OD) is defined as $OD=-\log(R/R_o)$ where R is the reflection of the inked plate and $R_o$ is the reflection of the plate prior to inking.

Figure 2B:
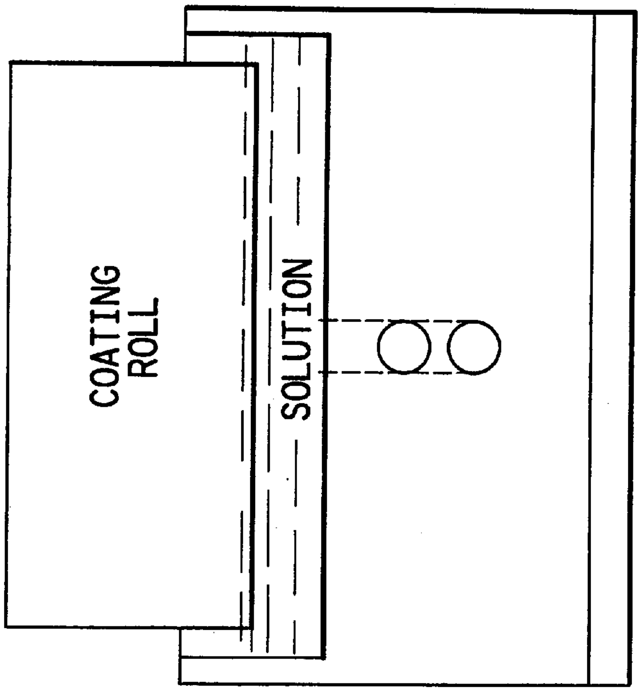
FIG. 2A is a side view and FIG. 2B is a front view.
Figure 2A:
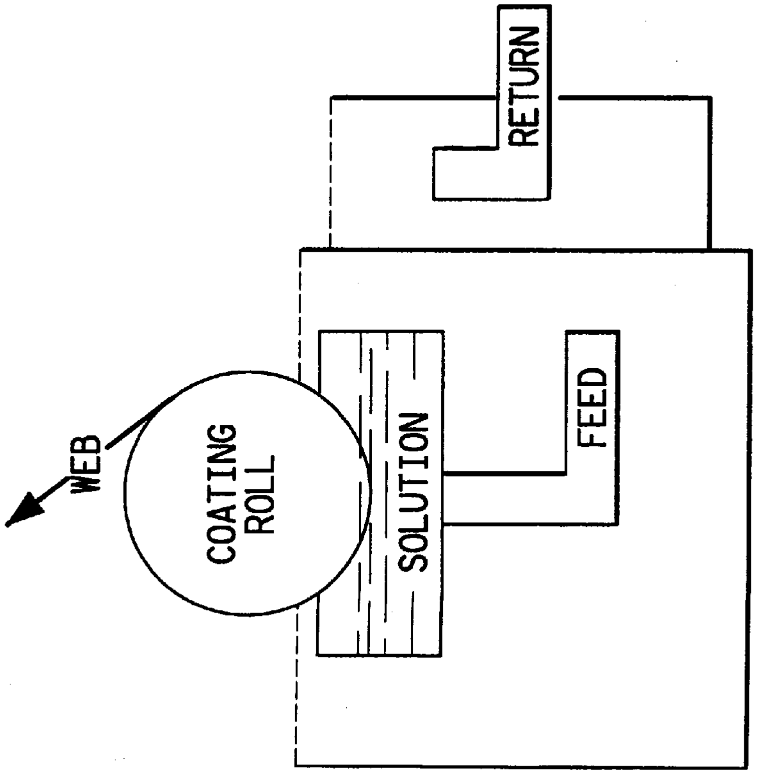

In the examples which follow, a "skim pan" method was used for making the inventive printing plates. In this method the film thickness produced is determined by the coating speed, with lower speeds leading to thinner films. In use, the coating solution is placed in a skim pan and the film held against a roller, touches the solution at the liquid/air interface, as shown in FIG. 2. The translation of the film relative to the pan carries the liquid at the interface coating the film onto the absorbing layer.

EXAMPLES

In the following non-limiting examples the plates were image using a Creo Plotter® (Creo Corp., Vancouver, BC), an external drum system in which the image is exposed using an array of infrared diode lasers. The laser head comprised 32 diode lasers that emit in the infrared spectral region at 830 mn. The pulse width is adjusted to 3 microseconds. In order to expose the plate, it is vacuum-held onto the drum surface with the hydrophobic film positioned away from the drum surface and the support directly in contact to the surface of the drum. The beam size is adjusted to 5.8, 8.7 or 10 microns, and the drum speed varied from 100 to 400 RPM. The laser fluence, or sensitivity, was calculated based on laser power and drum speed. The relationship can be expressed by the following equation:

$$phi=P/(d\times(RPM/60)\times\pi\times D)$$

where:

"phi" is the laser fluence in mJ/cm$^2$;

"p" is the laser power in mJ/sec (If more than one laser is used it must be multiplied by that number);

"d" is the diameter of the beam at the film in cm;

"D" is the diameter of the drum in cm; and

"RPM/60" is revolutions per second.

The ink densities, as a function of drum speed, were measured with a Macbeth densitometer (Model TR-927, Macbeth Process Measurements Co., Newburgh, N.Y.). The plates were inked using an ABDick Press (ABDick Co., Chicago, Ill.).

In the following examples, the solvents MEK (methyl ethyl ketone) and cyclohexanone are dried off in the making of the radiation absorbing polymer layer. The following abbreviations are used in the examples below:

MAA—methacrylic acid

BZMA—benzyl methacrylate

DMAEMA—β-dimethylaminoethyl methacrylate

ETEGMA—ethylthioethyleneglycol methacrylate

The following examples were performed on the embodiments as described below. All percentages are by weight unless otherwise indicated.

EXAMPLE 1

Metal Layer Used as Radiation Means

The plate comprised a 2 mil thick metallized Mylar® polyester base (E. I. du Pont de Nemours and Company, Wilmington, Del., type 200 D), coated with a nitrocellulose (Hercules, Inc., Wilmington, Del.) layer. The 1 micron nitrocellulose layer was coated using a skim pan method as previously described and shown in FIG. 2. The coating speed was 15 ft/min, and the dryer temperatures were held at 47° C., 61° C. and 60° C., respectively. A thin Cr layer used for light absorption and subsequent heating was sputtered onto the nitrocellulose layer to a thickness of 60Å ($60\times10^{-10}$ m by Flex Products, Inc., Santa Rosa, Calif.). The metal thickness was monitored in situ using a quartz crystal and by measuring transmission (40%) at 633 nm.

The hydrophobic film, $TFE_xHFP_{1-x}$ perfluorocopoylmer, where x=0.59, fabricated by E. I. du Pont de Nemours and Company, Wilmington, Del., was hand coated from a 1% solution in FC-75 (Fluorinert, 3M Co., St. Paul, Minn.) at ambient temperature onto the Cr layer to a thickness of 0.3 microns using #3 wire rods. The complete coverage of the Cr layer was corroborated by microscopy. The formulations were evaluated by writing 1×5 cm solid areas at a number of different drum speeds ranging from 100 to 275 RPM at a 5.8 micron pitch. The exposed areas were then inked by hand using a pipette and air dried. The ink densities as a function of drum speed were measured with a reflection Macbeth densitometer and are recorded in Table 3. The composition of the ink as well as the composition of the polymeric layer were as follows:

Polymeric Layer:

| | |
|---|---|
| Nitrocellulose | 283.75 g |
| Dibutyl Phthalate | 31.32 g |
| MEK | 3319.33 g |
| Cyclohexanone | 1000.00 g |

Ink [(E77300)]:

Polymeric binder for the ink is a block copolymer of MAA, BZMA, DMAEMA and ETEGMA, MAA/BZMA/DMAEMA/ETEGMA 12/15/3/14; Pigment; Regal 660 carbon black (Cabot Corp., Billerica, Mass.); 15% pigment loading with pigment to polymer ratio of 2:1.

TABLE 3

| Drum Speed (RPM) | Sensitivity (mJ/cm$^2$) | OD |
|---|---|---|
| 100 | 792 | 1.37 |
| 125 | 634 | 1.15 |
| 150 | 528 | 1.04 |
| 175 | 453 | 0.82 |
| 200 | 396 | 0.81 |
| 225 | | 0.04 |
| 250 | | 0.00 |
| 275 | | 0.00 |

EXAMPLES 2 AND 3

Radiation Means Comprising Dye or Pigment

A 2 mil thick Mylar® polyester base was coated with an absorbing layer conprising nitrocellulose as the decomposable binder in combination with an absorbing dye or pigment or combination of dye and pigment to absorb the incident radiation. The absorbing layer was hand coated using a #4 wire rod to a thickness of 0.7 microns. A $TFE_{0.59}HFP_{0.41}$ top layer was hand coated from a 1% solution in FC-75 at ambient temperature onto the absorbing layer of a thickness of 0.3 microns using #3 wire rods. The formulations were evaluated by writing 1×5 cm solid areas at a number of different drum speeds ranging from 100 to 275 RPM at 25 RPM increments at 10.0 micron pitch. The exposed areas were then inked with the same ink composition as in Ex. 1 using a pipette and air dried. The density of the inked plate as a function of drum speed, measured with a reflection densitometer, is listed in Table 4. The data indicate that while the plate of Example 2 can be inked at 200 RPM and 210 mJ/cm$^2$ to give an OD of 1.49, the plate of Example 3, which does not include the radiation absorbing dye of Example 2, cannot be written at that low fluence or sensitivity level at all. Therefore, the plate of Example 2 is considerably faster than that of Example 3.

The composition of the decomposition/absorbing layers are listed below:

EXAMPLE 2

Radiation Absorbing Layer:

| | |
|---|---|
| Nitrocellulose | 7.0 g |
| Tic-5C | 1.5 g |
| Black Dispersion | 6.0 g |
| MEK | 53.47 g |

Black Dispersion in Radiation Absorbing Layer:

| | |
|---|---|
| Carbon Black (Regal 660) | 70 g |
| Methacrylate Polymer (AB1030, E. I. du Pont de Nemours and Company, Wilmington, DE) | 30 g |
| MEK/Cyclohexanone (60/40) | 300 g |
| Pigment/Dispersant/% solids | 70/30/25 |

EXAMPLE 3

Radiation Absorbing Layer:

| | |
|---|---|
| Nitrocellulose | 8.5 g |
| Black Dispersion | 6.0 g |
| MEK | 53.47 g |

TABLE 4

| Drum Speed (RPM) | Sensitivity (mJ/cm$^2$) | OD Ex. 2 | OD Ex. 3 |
|---|---|---|---|
| 100 | 420 | 2.65 | 0.48 |
| 125 | 336 | 2.46 | 0.34 |
| 150 | 280 | 2.43 | 0.17 |
| 175 | 240 | 1.86 | 0.03 |
| 200 | 210 | 1.49 | |
| 225 | 187 | 1.21 | |
| 250 | 168 | 0.89 | |
| 275 | 153 | 0.49 | |
| 300 | 140 | 0.20 | |
| 325 | 129 | 0.16 | |
| 350 | 120 | 0.14 | |
| 375 | 112 | 0.13 | |
| 400 | 105 | 0.07 | |

EXAMPLES 4 TO 6

Variation in Thickness of Radiation Absorbing Layer

A 2 mil thick Mylar® polyester base was coated with an absorbing layer of the formulation listed below to thicknesses of 0.7, 1 and 2 microns. A 0.3 micron $TFE_{0.59}HFP_{0.41}$ top layer was hand coated from a 1% solution in FC-75 at ambient temperature onto the decomposition layers using #3 wire rods. The formulations were evaluated by writing 1×5 cm solid areas at a number of different drum speeds ranging from 100 to 400 RPM at 8.7 micron pitch. The exposed areas were then inked by hand by rolling the ink on the exposed surface with a #6 wire rod. The plates were inked using the water soluble black ink dispersion [(E77053-5)] as shown below and air dried. The density of the inked plate as a function of drum speed and radiation absorbing layer thickness, measured with a transmission densitometer, are listed in Table 5. While Examples 4, 5 and 6 all show approximately the same OD, Examples 4 and 5, where the layer thickness is 0.7 and 1.0 μm, respectively, show greater OD's than Example 6, indicating that radiation absorbing layer thicknesses less than about 2 μm are preferred. The composition of the ink and decomposition/absorbing layers are listed below:

Radiation Absorbing Layer:

| | |
|---|---|
| Carboset 526 (an alkali-soluble acrylic copolymer commercially available from B F Goodrich, Cleveland, OH) | 1.5 g |
| Nitrocellulose | 1.5 g |
| Tic-5C | 0.45 g |
| MEK | 17.00 g |

Ex. 4: Coated with a #4 rod for film of 0.7 micron thickness

Ex. 5: Coated with a #6 rod for film of 1.0 micron thickness

Ex. 6: Coated with a #10 rod for film of 2.0 micron thickness

[E77053-5] Water Soluble Black Ink Dispersion:

Pigment/binder ratio 2:1

Degussa FW-18/Carbon Black—15% solids neutralized with $NH_4OH$ (Degussa Corp., Ridgefield Park, N.J.)

TABLE 5

| | | OD | | |
|---|---|---|---|---|
| Drum Speed (RPM) | Sensitivity (mJ/cm$^2$) | Ex. 4 | Ex. 5 | Ex. 6 |
| 100 | 525 | 1.85 | 1.86 | 1.74 |
| 125 | 420 | 2.05 | 1.85 | 1.92 |
| 150 | 350 | 1.98 | 1.71 | 1.89 |
| 175 | 300 | 2.00 | 1.80 | 1.77 |
| 200 | 263 | 1.97 | 1.67 | 1.50 |
| 225 | 233 | 2.05 | 1.75 | 1.65 |
| 250 | 210 | 2.15 | 1.87 | 1.69 |
| 275 | 191 | 1.95 | 1.98 | 1.83 |
| 300 | 175 | 2.02 | 1.81 | 1.69 |
| 325 | 162 | 2.11 | 1.98 | 1.84 |
| 350 | 150 | 2.00 | 1.81 | 1.93 |
| 375 | 140 | 2.17 | 1.85 | 1.66 |
| 400 | 131 | 1.93 | 1.99 | 1.76 |

EXAMPLES 7 TO 10

Variation in Polymeric Content of Radiation Absorbing Layer

The plates in Examples 7, 8, and 9 are identical to those in Examples 4, 5 and 6, respectively. The plate in Example 10 differs from that in Example 7 only in the composition of the radiation absorbing layer which is listed below. The formulations were evaluated by writing 1×5 cm solid areas at a number of different drum speeds ranging from 100 to 275 RPM at a 10.0 micron pitch. The exposed areas were then inked by hand by rolling the ink on the exposed surface with a #6 wire rod. The plates were inked using the water soluble black dispersion as described in Example 1 and air dried. The density of the inked plate as a function of drum speed is listed in Table 6. The use of nitrocellulose without the addition of Carboset 526 provides for good OD for all speeds and sensitivities tested.

Radiation Absorbing Layer (Example 10)

| | |
|---|---|
| Nitrocellulose | 3.0 g |
| Tic-5C | 0.45 g |
| MEK | 17.0 g |

Coated with #4 rod for a film thickness of 0.7 micron

TABLE 6

| Drum Speed | Sensitivity | OD | | | |
|---|---|---|---|---|---|
| (RPM) | (mJ/cm$^2$) | Ex. 7 | Ex. 8 | Ex. 9 | Ex. 10 |
| 100 | 420 | 1.71 | 1.71 | 1.68 | 1.12 |
| 125 | 336 | 1.65 | 1.55 | 1.66 | 1.35 |
| 150 | 280 | 1.61 | 1.57 | 1.74 | 1.31 |
| 175 | 240 | 1.69 | 1.33 | 1.86 | 1.32 |
| 200 | 210 | 1.86 | 1.19 | 1.78 | 1.21 |
| 225 | 187 | 1.79 | 0.83 | 1.07 | 1.25 |
| 250 | 168 | 0.92 | 0.75 | 0.76 | 1.11 |
| 275 | 153 | 0.47 | 0.54 | 0.54 | 1.01 |

EXAMPLES 11 TO 16

Plate Sensitivity for Polymeric Content of Radiation Absorbing Layer and Comparison of Perfluorocopolymers Examples 11 through 16 show the sensitivity of plates for a number of different polymers, or binders, used in the radiation absorbing layer, and compare $TFE_{0.59}HFP_{0.41}$ and Teflon AF1601® as hydrophobic overcoats. Table 7 shows which binder was used in a 3 g quantity in each example. In each example 0.45 g Tic-5c was used as the dye. In Examples 11, 13, 14, 15 and 16, 17 g of MEK was used as the solvent; in Example 12, a solvent blend of 10.2 g MEK and 6.8 g cyclohexanone was used. Each example was made as "a" and "b", with "a" plates having $TFE_{0.59}HFP_{0.41}$ as the top layer, and "b" plates having Teflon AF1601® as the top layer. The formulations were evaluated by writing 1×5 cm solid areas at a number of different drum speeds ranging from 100 to 400 RPM at 10 micron pitch. The exposed areas were then inked by hand by rolling the ink on the exposed surface with a #6 wire rod. The plates were inked using a DuPont-Howson ink (Cat. No. 12C27-8H70071, DuPont-Howson, Leeds, England) and air dried. The density of the inked plate as a function of drum speed is listed in Table 8. Both $TFE_{0.59}HFP_{0.41}$ and Teflon AF1601® are shown to work well.

TABLE 7

| Example No. | Radiation Absorbing Layer Binder |
|---|---|
| 11a and 11b | Nitrocellulose (Hercules, Inc., Wilmington, DE) |
| 12a and 12b | Polyvinylchloride (Aldrich Chem., Milwaukee, WI) |
| 13a and 13b | Elvacite ® 2045 (Polybutyl methacrylate) (Dupont, Wilmington, DE) |
| 14a and 14b | Elvacite ® 1010 (Polymethyl methacrylate) (DuPont, Wilmington, DE) |
| 15a and 15b | Poly α-Methyl Styrene (Aldrich Chem., Milwaukee, WI) |
| 16a and 16b | QPAC-40 (Polypropylene Carbonate, Air Products, Inc., Trexlertown, PA) |

TABLE 8

| Speed (RPM) | Sensitivity (mJ/cm$^2$) | OD 11 a | 11 b | 12 a | 12 b | 13 a | 13 b | 14 a | 14 b | 15 a | 15 b | 16 a | 16 b |
|---|---|---|---|---|---|---|---|---|---|---|---|---|---|
| 100 | 408 | 1.72 | 1.82 | 1.50 | 1.53 | 0 | 0 | 1.14 | 0.69 | 1.61 | 1.58 | 1.69 | 1.67 |
| 125 | 326 | 1.76 | 1.76 | 1.46 | 1.63 | 0 | 0 | 0 | 0 | 1.50 | 1.57 | 1.75 | 1.63 |
| 150 | 272 | 1.72 | 1.82 | 1.51 | 1.61 | 0 | 0 | 0 | 0 | 1.48 | 1.53 | 1.64 | 1.69 |
| 175 | 233 | 1.72 | 1.81 | 1.47 | 1.56 | 0 | 0 | 0 | 0 | 1.53 | 1.63 | 1.75 | 1.69 |
| 200 | 204 | 1.72 | 1.86 | 1.56 | 1.56 | 0 | 0 | 0 | 0 | 0 | 1.64 | 1.71 | 1.67 |
| 225 | 181 | 1.77 | 1.70 | 1.55 | 1.57 | 0 | 0 | 0 | 0 | 0 | 1.61 | 1.12 | 1.58 |
| 250 | 163 | 1.73 | 1.77 | 1.66 | 1.51 | 0 | 0 | 0 | 0 | 0 | 0 | 0.77 | 1.03 |
| 275 | 148 | 1.56 | 1.76 | 1.61 | 1.38 | 0 | 0 | 0 | 0 | 0 | 0 | 0 | 0.54 |
| 300 | 136 | 1.29 | 1.41 | 1.55 | 1.45 | 0 | 0 | 0 | 0 | 0 | 0 | 0 | 0 |
| 325 | 126 | 1.13 | 0.96 | 1.26 | 0.87 | 0 | 0 | 0 | 0 | 0 | 0 | 0 | 0 |
| 350 | 117 | 0.92 | 0.95 | 0.74 | 0.40 | 0 | 0 | 0 | 0 | 0 | 0 | 0 | 0 |
| 375 | 109 | 0.82 | 0.94 | 0.46 | 0.32 | 0 | 0 | 0 | 0 | 0 | 0 | 0 | 0 |
| 400 | 102 | 0.53 | 0.87 | 0 | 0.18 | 0 | 0 | 0 | 0 | 0 | 0 | 0 | 0 |

EXAMPLES 17 TO 20

Variation in Dyes and Polymeric Binders in Radiation Absorbing Layer

The following two layer systems show the sensitivity of plates for two different dyes in combination with a number of different polymeric binders in the radiation absorbing layer. In each case, $TFE_{0.59}HFP_{0.41}$ was used as the hydrophobic topcoat. In each example, "a" plates contained 0.45 g of SQS as the dye, and "b" plates contained 0.45 g Kodak HITC 14086 as the dye. Table 9 shows which was used in a 3 g quantity in each example. In Examples 17, 19 and 20, 17 g of MEK were used as the solvent; in Example 18, 10.2 g of MEK and 6.8 g cyclohexanone were blended and used. The formulations were evaluated by writing 1×5 cm solid areas at a number of different drum speeds ranging from 100 to 400 RPM at 10 micron pitch. The exposed areas were then inked by hand by rolling the ink on the exposed surface with a #6 wire rod. The plates were inked using the DuPont-Howson ink in an ABDick press and air dried. The density of the inked plate as a function of drum speed is listed in Table 10.

TABLE 9

| Example No. | Radiation Absorbing Layer Polymer Binder |
|---|---|
| 17a and 17b | Nitrocellulose |
| 18a and 18b | Polyvinylchloride |
| 19a and 19b | Poly α-Methyl Styrene |
| 20a and 20b | QPAC-40 |

TABLE 10

| Speed (RPM) | Sensitivity (mJ/cm$^2$) | OD 17 a | 17 b | 18 a | 18 b | 19 a | 19 b | 20 a | 20 b |
|---|---|---|---|---|---|---|---|---|---|
| 100 | 408 | 1.51 | 1.57 | 1.58 | 1.32 | 1.48 | 1.56 | 1.73 | 1.79 |
| 125 | 326 | 1.44 | 1.53 | 1.44 | 1.33 | 1.46 | 1.33 | 1.75 | 1.81 |
| 150 | 272 | 1.56 | 1.47 | 1.54 | 0.61 | 1.42 | 1.45 | 1.82 | 0.72 |
| 175 | 233 | 1.47 | 1.53 | 1.56 | 0 | 1.32 | 0 | 1.88 | 0 |
| 200 | 204 | 1.56 | 1.67 | 1.58 | 0 | 1.45 | 0 | 1.82 | 0 |
| 225 | 181 | 1.51 | 1.63 | 1.63 | 0 | 1.52 | 0 | 1.98 | 0 |
| 250 | 163 | 1.56 | 1.19 | 1.63 | 0 | 1.51 | 0 | 1.97 | 0 |
| 275 | 148 | 1.61 | 1.02 | 1.63 | 0 | 1.57 | 0 | 1.67 | 0 |
| 300 | 126 | 1.68 | 0.65 | 1.61 | 0 | 1.54 | 0 | 1.68 | 0 |
| 325 | 126 | 1.73 | 0.50 | 1.78 | 0 | 1.64 | 0 | 1.68 | 0 |
| 350 | 117 | 1.68 | 0 | 1.81 | 0 | 1.30 | 0 | 1.71 | 0 |
| 375 | 109 | 1.70 | 0 | 1.76 | 0 | 1.52 | 0 | | |
| 400 | 102 | 1.67 | 0 | 1.72 | 0 | 0.75 | 0 | | |

EXAMPLES 21 AND 22

Variation in Support Material

In Examples 21 and 22, the radiation absorbing layers were coated with a 0.3 micron $TFE_{0.59}HFP_{0.41}$ layer on top. In Example 21, a 2 mil thick Mylar® polyester base was hand coated to a 0.7 micron thickness with an absorbing layer comprising 8.5 g nitrocellulose, 57.97 g MEK and 1.5 g Tic-5c. In Example 22, an absorbing layer of the identical composition was coated onto anodized aluminum. The $TFE_{0.59}HFP_{0.41}$ film was hand coated from a 1% solution in FC-75 at ambient temperature onto the absorbing layer to a thickness of 0.3 microns using #3 wire rods. The formulations were inked on an ABDick press with Toyo inks (Toyo King Hyplus, MZ black 20515952, Toyo Ink Mfg. Co. Ltd., Japan). The plates were exposed as previously described using dot targets at 150 lines/inch at speeds ranging from 125 to 275 RPM at 25 RPM increments. Resolution targets for both plates prior to inking were 0.39 to 98% dots, and inked plates had a 2% to 98% dot resolution. After exposure, a latent image on the plate was seen and under a microscope one can determine the size of the smallest exposed dot and thus the resolution.

Although particular embodiments of the present invention have been described in the foregoing description, it will be understood by those skilled in the art that the invention is capable of numerous modifications, substitutions and rearrangements without departing from the spirit or essential attributes of the invention. Reference should be made to the appended claims, rather than to the foregoing specification, as indicating the scope of the invention.

What is claimed:

1. A printing plate, comprising:

(a) a support of sufficient thickness to provide structural integrity to allow for repeated use;

(b) a radiation absorbing layer contiguous to said support comprising (i) a polymer with a temperature of decomposition in the range of 130° C. to 360° C., and (ii) means for absorbing radiation; and (c) a layer comprising a hydrophobic, substantially non-radiation absorbing film compared to the radiation absorbing layer, which is soluble in fluorinated solvents, and which is contiguous to said radiation absorbing layer, said film having a substantially uniform surface and a thickness of less than about 2.0 μm.

2. The printing plate of claim 1 wherein the radiation absorbing layer has a thickness of between about 0.1 to 2.0 μm.

3. The printing plate of claim 1 wherein the hydrophobic film layer has a thickness of between about 0.2 to 0.6 μm.

4. The printing plate of claim 1 wherein the polymer has a temperature of decomposition of between abou 150° C. to 300° C.

5. The printing plate as recited in claim 1, wherein said polymer is selected from the group consisting of polyvinylchloride, chlorinated polyvinylchloride, nitrocellulose, poly(butylmethacrylate), poly(α-methylstyrene), poly(propylene carbonate), and poly(methylmethacrylate).

6. The printing plate as recited in claim 1, wherein said radiation absorbing means comprises a dye or pigment.

7. The printing plate as recited in claim 6, wherein the pigment is carbon black and the dye is selected from the group consisting of 1,1',3,3,3',3'-hexamethylindotricarbocyanine iodide, 4-[[3-[[2,6-bis( 1,1-dimethylethyl)-4H-thiopyran-4-ylidene]methyl]-2-hydroxy-4-oxo-2-cyclobuten-1-ylidene]methyl]-2,6-bis(1,1-dimethylethyl)-, inner salt, and 2-[2-[2-chloro-3-[2-(1,3-dihydro-1,2,2-trimethyl-2H-indol-2-ylidene)ethylidene]-1-cyclopenten-1-yl]ethenyl]-1,3,3-trimethyl-3H-indolium, trifluoromethane sulfonate salt.

8. The printing plate as recited in claim 1, wherein said radiation absorbing means comprises a separate layer positioned either between the support and the polymer of said radiation absorbing layer or between the hydrophobic film layer and the polymer of said radiation absorbing layer.

9. The printing plate as recited in claim 1, wherein said support comprises a material selected from the group consisting of anodized aluminum, aluminized polyester, polyester, and aluminized stainless steel.

10. The printing plate as recited in claim 1, wherein said hydrophobic film is selected from the group consisting of a copolymer or polytetrafluoroethylene and bis-2,2-trifluoromethyl-4,5-difluoro-1,3-dioxole, copolymers of hexafluoropropylene and tetrafluoroethylene ranges from about 20 percent to about 60 percent, and the weight percent of hexafluoropropylene ranges from about 80 percent to about 40 percent, and wherein said film is about 0.2 μm to about 0.6 μm thick.

11. The printing plate as recited in claim 1, wherein said hydrophobic film is modified by the addition of a fluoropolymer containing at least one $CF_3$ group, a fluorinated silicone, or a fluorinated acrylate.

12. A printing plate, comprising:

(a) a support of sufficient thickness to provide structural integrity to allow for repeated use;

(b) a radiation absorbing layer contiguous to said support comprising;

(i) a polymer with a temperature of decomposition in the range of 130° C. to 360° C., and (ii) means for absorbing radiation; and (c) a layer comprising a hydrophobic, substantially non-radiation absorbing film, compared to the radiation absorbing layer, which is soluble in fluorinated solvents, and which is contiguous to said radiation absorbing layer, said film having a substantially uniform surface and a thickness of less than about 2.0 μm, wherein said radiation absorbing means comprises a separate layer positioned either between the support and the polymer of said radiation absorbing layer or between the hydrophobic film layer and the polymer of said radiation absorbing layer, wherein said separate layer is selected from the group consisting of aluminum, chromium, antimony, titanium, bismuth, zirconium, nickel, indium, strontium, stainless steel and titanium dioxide.

13. A printing plate, comprising:

(a) a support of sufficient thickness to provide structural integrity to allow for repeated use;

(b) a radiation absorbing layer contiguous to said support comprising;

(i) a polymer with a temperature of decomposition in the range of 130° C. to 360° C., and (ii) means for absorbing radiation; and (c) a layer comprising a hydrophobic, substantially non-radiation absorbing film, compared to the radiation absorbing layer, which is soluble in fluorinated solvents, and which is contiguous to said radiation absorbing layer, said film having a substantially uniform surface and a thickness of less than about 2.0 μm, wherein said support is comprised of aluminum, said radiation absorbing layer is comprised of nitrocellulose and 2-[2-[2-chloro-3-[2-(1,3-dihydro-1,2,2-trimethyl-2H-indol-2-ylidene)ethylidene]-1-cyclopenten-1-yl]ethenyl]-1,3,3-trimethyl-3H-indolium, trifluoromethane sulfonate salt at a level of 10% relative to the amount of nitrocellulose, and said hydrophobic film is a copolymer of hexafluoropropylene and tetrafluoroethylene, where the weight percent of tetrafluoroethylene ranges from about 20 percent to about 60 percent and the weight percent of hexafluoropropylene ranges from about 80 percent to about 40 percent.

14. A printing plate, comprising:

(a) a support of sufficient thickness to provide structural integrity to allow for repeated use;

(b) a radiation absorbing layer contiguous to said support comprising;

(i) a polymer with a temperature of decomposition in the range of 130° C. to 360° C., and (ii) means for absorbing radiation; and (c) a layer comprising a hydrophobic, substantially non-radiation absorbing film, compared to the radiation absorbing layer, which is soluble in fluorinated solvents, and which is contiguous to said radiation absorbing layer, said film having a substantially uniform surface and a thickness of less than about 2.0 μm, wherein said radiation absorbing means comprises a dye or pigment, wherein the support is aluminum, the polymer of the radiation absorbing layer is selected from the group consisting of polyvinylchloride and chlorinated polyvinylchloride, the dye is 2-[2-[2-chloro-3-[2-(1,3-dihydro-1,2,3-trimethyl-2H-indol-2-ylidene)ethylidene]-1-cyclopenten-1-yl]ethenyl]-1,3,3-trimethyl-3H-indolium trifluoromethane sulfonate salt, and the hydrophobic film is a copolymer of hexafluoropropylene and tetrafluoroethylene, where the weight percent of tetrafluoroethylene ranges from about 20 percent to about 60 percent and the weight percent of hexafluoropropylene ranges from about 80 percent to about 40 percent.

15. A method of developing a printing plate comprising the steps of:

(A) exposing a printing plate comprising:

(1) a support of sufficient thickness to provide structural integrity to allow for repeated use;

(2) a radiation absorbing layer contiguous to said support, comprising (i) a polymer with a temperature of decomposition in the range of 130° C. to 360° C., and (ii) means for absorbing radiation; and (3) a layer comprising a hydrophobic, substantially non-radiation absorbing film, compared to the radiation absorbing layer, which is soluble in fluorinated solvents, and which is contiguous to said radiation absorbing layer, said film having a substantially uniform surface and a thickness of less than about 2.0 μm;

to a radiation source such that certain regions of the hydrophobic film are removed thereby exposing the underlying radiation absorbing layer; and (B) applying printing ink such that the ink adheres only to the exposed radiation absorbing layer where the hydrophobic film has been removed but not to the unexposed regions where the hydrophobic film has not been removed.

16. The method of claim 15 wherein the radiation source is a laser.

17. The method of claim 15 wherein the printing ink is a water-based ink.

18. The method of claim 15 wherein the hydrophobic film is modified by the addition of a fluoropolymer containing at least one $CF_3$ group, a fluorinated silicone or a fluorinated acrylate.

19. The method of claim 18 wherein the printing ink is an oil-based ink.

* * * * *